US008373198B2

(12) United States Patent
Chung et al.

(10) Patent No.: US 8,373,198 B2
(45) Date of Patent: Feb. 12, 2013

(54) SUBSTRATE INCLUDING THIN FILM TRANSISTOR, METHOD OF MANUFACTURING THE SUBSTRATE, AND ORGANIC LIGHT EMITTING DISPLAY APPARATUS INCLUDING THE SUBSTRATE

(75) Inventors: Yun-Mo Chung, Yongin (KR); Ki-Yong Lee, Yongin (KR); Jin-Wook Seo, Yongin (KR); Min-Jae Jeong, Yongin (KR); Yong-Duck Son, Yongin (KR); Byung-Soo So, Yongin (KR); Seung-Kyu Park, Yongin (KR); Byoung-Keon Park, Yongin (KR); Dong-Hyun Lee, Yongin (KR); Kil-Won Lee, Yongin (KR); Tak-Young Lee, Yongin (KR); Jong-Ryuk Park, Yongin (KR); Jae-Wan Jung, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 12/929,694

(22) Filed: Feb. 9, 2011

(65) Prior Publication Data
US 2011/0233529 A1 Sep. 29, 2011

(30) Foreign Application Priority Data

Mar. 24, 2010 (KR) .......................... 10-2010-0026403

(51) Int. Cl.
 *H01L 29/66* (2006.01)
(52) U.S. Cl. .......................................... 257/192; 257/88
(58) Field of Classification Search .................. 257/192, 257/88
 See application file for complete search history.

(56) References Cited

U.S. PATENT DOCUMENTS 7,462,291 B2   12/2008 Lee
7,842,943 B2 * 11/2010 Lee et al. ..................... 257/40

FOREIGN PATENT DOCUMENTS

| JP | 2004-356216 A | 12/2004 |
| KR | 2002-0032196 A | 5/2002 |
| KR | 10-2003-0060403 A | 7/2003 |
| KR | 10-2005-0066579 A | 6/2005 |
| KR | 10-2009-0070286 A | 7/2009 |
| KR | 10-2009-0114919 A | 11/2009 |
| KR | 10 2010-0008707 A | 1/2010 |

OTHER PUBLICATIONS

Korean Office Action in KR 10 2010-0026403, dated May 26, 2011 (Chung, et al.).

* cited by examiner

*Primary Examiner* — Douglas Menz
(74) *Attorney, Agent, or Firm* — Lee & Morse, P.C.

(57) ABSTRACT

A substrate including a thin film transistor, the substrate including an active layer disposed on the substrate, the active layer including a channel area and source and drain areas, a gate electrode disposed on the active layer, the channel area corresponding to the gate electrode, a gate insulating layer interposed between the active layer and the gate electrode, an interlayer insulating layer disposed to cover the active layer and the gate electrode, the interlayer insulating layer having first and second contact holes partially exposing the active layer, source and drain electrodes disposed on the interlayer insulating layer, the source and drain areas corresponding to the source and drain electrodes, and ohmic contact layers, the ohmic contact layers being interposed between the interlayer insulating layer and the source and drain electrodes, and contacting the source and drain areas through the first and second contact holes.

13 Claims, 3 Drawing Sheets

SUBSTRATE INCLUDING THIN FILM TRANSISTOR, METHOD OF MANUFACTURING THE SUBSTRATE, AND ORGANIC LIGHT EMITTING DISPLAY APPARATUS INCLUDING THE SUBSTRATE

BACKGROUND

1. Field

Embodiments relate to a substrate including a thin film transistor, a method of manufacturing the substrate, and an organic light emitting display apparatus including the substrate.

2. Description

Flat display devices may include emissive type and a non-emissive type display devices. Emissive type display devices may include, for example, flat cathode ray tubes, plasma display panels (PDPs), and electroluminescent display devices. Non-emissive type display devices may include liquid crystal displays (LCDs). Electroluminescent display devices may have a wide viewing angle, excellent contrast, and rapid response speed and, thus, have recently been highlighted as the next generation display devices. Such electroluminescent display devices may include inorganic electroluminescent devices or organic electroluminescent devices, referring to the materials for forming an emission layer.

Organic electroluminescent devices may be used in self-luminous displays that emit light by electrical excitation of fluorescent organic compounds. As the electroluminescent devices may be driven using a low voltage, may be easily made thin, and have a wide viewing angle and rapid response speed, they have received considerable attention.

An organic electroluminescent device may include an emission layer formed of an organic material and interposed between an anode and a cathode. When an anode voltage and a cathode voltage are respectively applied to the anode and the cathode, holes injected from the anode move to the emission layer through a hole transport layer and electrons move from the cathode to the emission layer through an electron transport layer, so that the holes and the electrons recombine in the emission layer and form excitons.

The excitons transition from an excited state to a ground state, thereby making the fluorescent molecules of the emission layer emit light and form an image. A full-color type organic electroluminescent device may include pixels that emit red R, green G, and blue B color to thus realize a full color image.

In such an organic electroluminescent device, a pixel defining layer may be formed on both ends of the anode. A predetermined opening may be formed in the pixel defining layer. Then, the emission layer and the cathode may be sequentially formed on the anode exposed to the outside through the opening.

SUMMARY

It is a feature of an embodiment to provide a substrate including a thin film transistor that may be manufactured without using an ion doping process, a method of manufacturing the substrate, and an organic light emitting display apparatus including the substrate.

At least one of the above and other features and advantages may be realized by providing a substrate including a thin film transistor, the substrate including an active layer disposed on the substrate, the active layer including a channel area and source and drain areas, a gate electrode disposed on the active layer, the channel area corresponding to the gate electrode, a gate insulating layer interposed between the active layer and the gate electrode, an interlayer insulating layer disposed to cover the active layer and the gate electrode, the interlayer insulating layer having first and second contact holes partially exposing the active layer, source and drain electrodes disposed on the interlayer insulating layer, the source and drain areas corresponding to the source and drain electrodes, and ohmic contact layers, the ohmic contact layers being interposed between the interlayer insulating layer and the source and drain electrodes, and contacting the source and drain areas through the first and second contact holes.

The ohmic contact layers may include amorphous silicon layers including ion impurities, or multi-crystalline silicon layers including ion impurities.

The ion impurities may be N+ or P+ impurities.

The ohmic contact layers may be plasma enhanced chemical vapor deposition (PECVD) layers formed by injecting phosphorous-based gas or boron-based gas during forming of the amorphous silicon layers or the multi-crystalline silicon layers.

The source and drain areas may be conductive.

The source and drain areas may be conductive due to a plasma process using phosphorous-based gas or boron-based gas.

First and second areas of the source and drain areas that contact the ohmic contact layers may be conductive.

The first and second areas may be conductive due to a plasma process using phosphorous-based gas or boron-based gas after forming the ohmic contact layers.

First and second areas of the source and drain areas that contact the ohmic contact layers may be conductive.

The first and second areas may be conductive due to a plasma process using phosphorous-based gas or boron-based gas after forming the ohmic contact layers.

The substrate may further include a buffer layer interposed between the substrate and the active layer to cover the substrate.

At least one of the above and other features and advantages may also be realized by providing a method of manufacturing a substrate, the method including forming an active layer on the substrate, the active layer including a channel area and source and drain areas, forming a gate insulating layer on the active layer, forming a gate electrode on the gate insulating layer, forming an interlayer insulating layer on the substrate to cover the gate electrode, forming first and second contact holes in the interlayer insulating layer to partially expose the source and drain areas, forming ohmic contact layers that contact the source and drain areas through the first and second contact holes, and forming source and drain electrodes disposed on the ohmic contact layers.

Forming the ohmic contact layers may include forming amorphous silicon layers including ion impurities, or forming multi-crystalline silicon layers including ion impurities.

The ion impurities may be N+ or P+ impurities.

Forming the ohmic contact layers may include injecting phosphorous-based gas or boron-based gas during a plasma enhanced chemical vapor deposition (PECVD) process used to form the amorphous silicon layers or the multi-crystalline silicon layers.

The method may further include, after forming the gate electrode and before forming the interlayer insulating layer, performing a plasma process on the source and drain areas using a phosphorous-based gas or boron-based gas so as to provide the source and drain areas with conductivity.

The method may further include, after depositing the ohmic contact layers on the interlayer insulating layer, performing a plasma process using phosphorous-based gas or boron-based gas so as to provide first and second area of the source and drain areas that contact the ohmic contact layers with conductivity.

The method may further include, after depositing the ohmic contact layers on the interlayer insulating layer, performing a plasma process using a phosphorous-based gas or boron-based gas so as to provide the ohmic contact layers that contact the source and drain areas with conductivity.

At least one of the above and other features and advantages may also be realized by providing an organic light emitting display apparatus, including an active layer disposed on a substrate, the active layer including a channel area and source and drain areas, a gate electrode disposed on the active layer, the channel area corresponding to the gate electrode, a gate insulating layer interposed between the active layer and the gate electrode, an interlayer insulating layer disposed to cover the active layer and the gate electrode, the interlayer insulating layer having first and second contact holes partially exposing the active layer, source and drain electrodes disposed on the interlayer insulating layer, the source and drain areas corresponding to the source and drain electrodes, ohmic contact layers, the ohmic contact layers being interposed between the interlayer insulating layer and the source and drain electrodes, and contacting the source and drain areas through the first and second contact holes, a passivation film covering the source and drain electrodes, a planarization film disposed on the passivation film, a pixel electrode disposed on the planarization film, the pixel electrode being connected to the drain electrode, a pixel defining layer exposing the pixel electrode, an intermediate layer disposed on the pixel electrode, the intermediate layer configured to emitting light, and an opposite electrode covering the intermediate layer and the pixel defining layer.

The ohmic contact layers may include amorphous silicon layers including ion impurities, or multi-crystalline silicon layers including ion impurities.

The ion impurities may be N+ or P+ impurities.

The ohmic contact layers may be plasma enhanced chemical vapor deposition (PECVD) layers, the PECVD including injecting a phosphorous-based gas or boron-based gas during forming of the amorphous silicon layers or the multi-crystalline silicon layers.

The source and drain areas may be conductive.

The source and drain areas may be conductive due to a plasma process using phosphorous-based gas or boron-based gas.

First and second areas of the source and drain areas that contact the ohmic contact layers may be conductive.

The first and second areas may be conductive due to a plasma process using phosphorous-based gas or boron-based gas after forming the ohmic contact layers.

First and second areas of the source and drain areas that contact the ohmic contact layers may be conductive.

The first and second areas may be conductive due to a plasma process using phosphorous-based gas or boron-based gas after forming the ohmic contact layers.

The organic light emitting display apparatus may further include a buffer layer interposed between the substrate and the active layer, the buffer layer covering the substrate.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
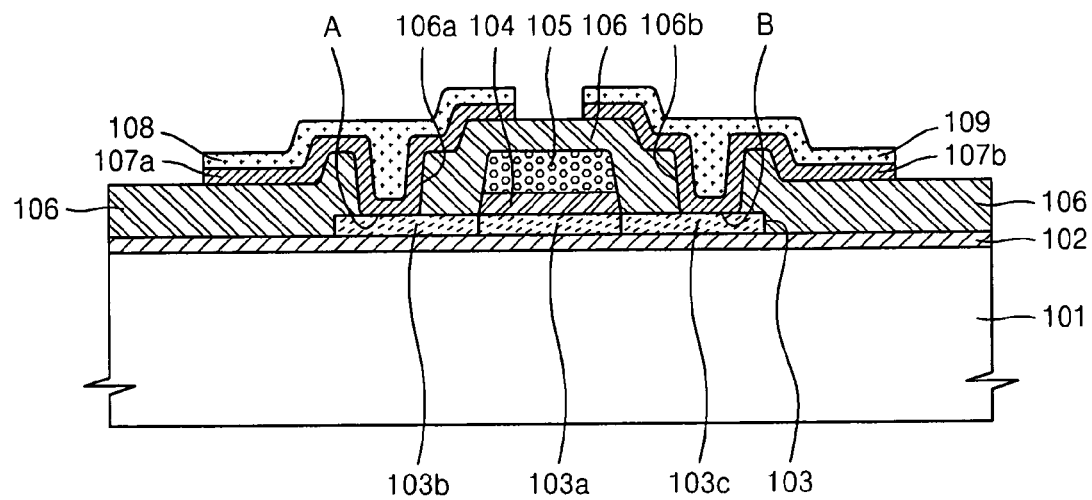
FIG. 1 illustrates a schematic cross-sectional diagram of a substrate including a thin film transistor according to an embodiment.

Korean Patent Application No. 10-2010-0026403, filed on Mar. 24, 2010, in the Korean Intellectual Property Office, and entitled: "Substrate Including Thin Film Transistor, Method of Manufacturing the Substrate, and Organic Light Emitting Display Apparatus Including the Substrate," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a schematic cross-sectional diagram of a substrate 101 including a thin film transistor according to an embodiment.

Referring to FIG. 1, the substrate 101 may have the thin film transistor formed thereon. The substrate 101 may be, e.g., a glass substrate or a plastic substrate.

A buffer layer 102 may be formed on the substrate 101. The buffer layer 102 may be formed of an insulating material having a barrier characteristic. For example, the buffer layer 102 may be formed of $SiO_2$ or $SiN_x$.

An active layer 103 may be formed on the buffer layer 102. The active layer 103 may be formed of a semiconductor material, and may be formed by patterning the semiconductor material formed on the buffer layer 102. For example, the semiconductor material may be deposited on the buffer layer, and the deposited semiconductor material may be patterned to form the active layer 103. The active layer 103 may be divided into a channel area 103a, a source area 103c, and a drain area 103b, with the channel area 103a connecting the source area 103c with the drain area 103b.

The active layer 103 may be formed of, e.g., an inorganic semiconductor material or an organic semiconductor material. Examples of the inorganic semiconductor material for forming the active layer 103 may include CdS, GaS, ZnS, CdSe, CaSe, ZnSe, CdTe, SiC, and Si. Examples of the organic semiconductor for forming the active layer 103 may include, as a polymer, polythiophene or a derivative thereof, poly(p-phenylene vinylene) (PPV) or a derivative thereof, polyparaphenylene or a derivative thereof, polyfluorene or a derivative thereof, polythiophene vinylene or a derivative thereof, polythiophene-hetero aromatic ring group copolymer or a derivative thereof, and as a low molecular weight material, pentacene, tetracene, oligoacene of naphthalene or derivatives thereof, alpha-6-thiophene, oligothiophene of alpha-5-thiophene or derivatives thereof, phthalocyanine (containing or not containing a metal) or derivatives thereof, pyromellitic dianhydride or pyromellitic diimide or derivatives thereof, and perylenetetracarboxylic acid dianhydride or perylenetetracarboxylic diimide or derivatives thereof.

A gate insulating layer 104 may be formed on the channel area 103a of the active layer 103. The gate insulating layer 104 may be formed of, e.g., an insulating material such as $SiO_2$ or $SiN_x$.

A gate electrode 105 may be formed on the gate insulating layer 104. The gate electrode 105 may be formed of, e.g., a conductive metal film such as MoW, Al, Cr, or Al/Cu, various conductive materials such as a conductive polymer, etc. The gate electrode 105 may be formed to cover an area corresponding to the channel area 103a of the active layer 103.

The gate insulating layer 104 and the gate electrode 105 may be formed as follows. First, an insulating material may be deposited on the buffer layer 102 so as to cover the active layer 103. Then, a metal layer may be deposited on the deposited insulating material. Next, the deposited insulating material and metal layer may be partially removed so as to expose the source area 103c and drain area 103b of the active layer 103. The deposited insulating material and metal layer may be removed by, e.g., dry etching or wet etching. When dry etching is used, the deposited insulating material and metal layer may be etched at the same time. When wet etching is used, the deposited insulating material and metal layer may be discontinuously etched, e.g., in separate etching operations. After the deposited insulating material and metal layer are etched, the gate insulating layer 104 and the gate electrode 105 may be stacked on the channel area 103a of the active layer 103.

An interlayer insulating layer 106 maybe formed to cover the active layer 103 and the gate electrode 105. The interlayer insulating layer 106 may be formed of, e.g., an insulating material such as $SiO_2$ or $SiN_x$.

The interlayer insulating layer 106 may have first and second contact holes 106a and 106b that partially expose the active layer 103. The first and second contact holes 106a and 106b may expose a second area A of the drain area 103b and a first area B of the source area 103c, respectively.

Ohmic contact layers 107a and 107b may be formed to contact the second area A of the drain area 103b and the first area B of the source area 103c, respectively, the second area A of the drain area 103b and the first area B of the source area 103c being exposed through the first and second contact holes 106a and 106b. The ohmic contact layers 107a and 107b may form an ohmic contact by contacting the exposed second area A of the drain area 103b and the exposed first area B of the source area 103c.

The ohmic contact layers 107a and 107b may be amorphous silicon layers including ion impurities, polycrystalline silicon layers, etc. For example, the ohmic contact layers 107a and 107b may be amorphous silicon layers including N+ or P+ ion impurities or polycrystalline silicon layers.

The ohmic contact layers 107a and 107b may be formed by injecting phosphorous-based gas or boron-based gas during forming of the amorphous silicon layers or the multi-crystalline silicon layers by using plasma enhanced chemical vapor deposition (PECVD). In this process, the ohmic contact layers 107a and 107b may be formed to be, e.g., amorphous silicon layers or multi-crystalline silicon layers, such layers having ion impurities without employing an ion injecting process. Thus, the ohmic contact layers 107a and 107b may include ion impurities by injecting phosphorous-based gas or boron-based gas during PECVD, which is used to form amorphous silicon layers (or multi-crystalline silicon layers), instead of depositing amorphous silicon layers on the interlayer insulating layer 106 and subsequently doping, i.e., injecting, them with ions as in the related art. In general, when the amorphous silicon layers are deposited on the interlayer insulating layer 106 and subsequently ions are doped therein, as in the related art, ion doping may be difficult when a large-sized flat display panel is formed (for example, the 8th generation or next generation organic light emitting display apparatus). In contrast, according to an embodiment, amorphous silicon layers (or multi-crystalline silicon layers) including ion impurities may be formed without using an ion injecting process so that a thin film transistor may be formed on a large-substrate by using a simple process. Also, as an expensive ion injection device is not needed, manufacturing costs may be reduced. In an implementation, the ohmic contact layers 107a and 107b may be formed, and formed to have conductivity, by a process that consists essentially of PECVD using a phosphorous- or boron-containing gas during the PECVD.

As described above, embodiments may provide a substrate including a thin film transistor, a method of manufacturing the substrate, and an organic light emitting display apparatus including the substrate, in which a separate ion injecting process is not needed to form ohmic contact layers. Thus, formation of the ohmic contact layers may be achieved without using the ion injecting process.

Source and drain electrodes (collectively, source/drain electrodes) 108 and 109 may be disposed on the ohmic contact layers 107a and 107b, respectively. The ohmic contact layers 107a and 107b and the source/drain electrodes 108 and 109 may be formed as follows. First, an amorphous silicon layer (or multi-crystalline silicon layer) including ion impurities may be formed to cover the interlayer insulating layer 106. Then, a metal layer for source/drain electrodes may be deposited on the amorphous silicon layer (or multi-crystalline silicon layer) including ion impurities. Then, the amorphous silicon layer (or multi-crystalline silicon layer) including ion impurities and the metal layer are patterned by using photolithography and thereby, the source/drain electrodes 108 and 109 are formed on the ohmic contact layers 107a and 107b.

Figure 2:
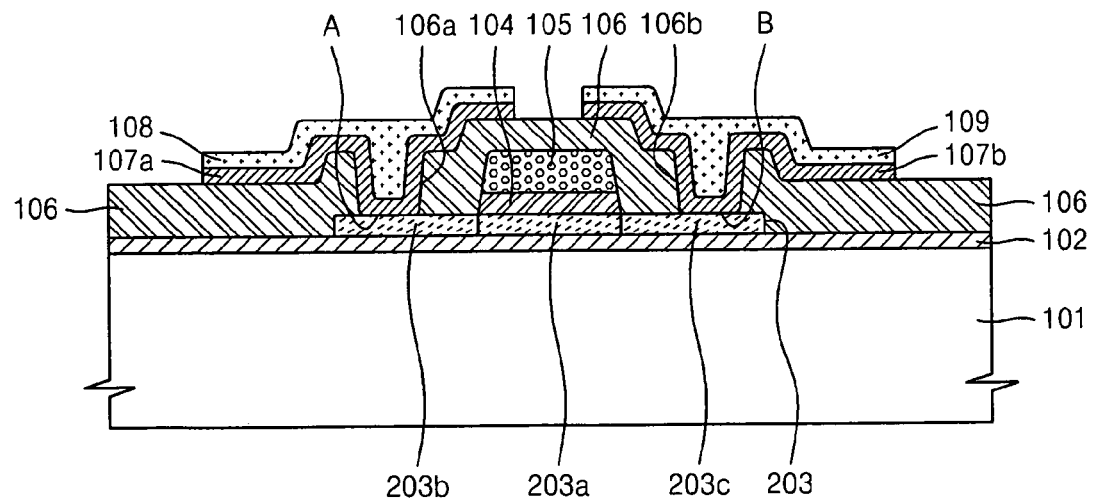
FIG. 2 illustrates a schematic cross-sectional diagram of a substrate including a thin film transistor according to another embodiment.

FIG. 2 illustrates a schematic cross-sectional diagram of a substrate including a thin film transistor according to another embodiment.

As compared to the substrate including the thin film transistor illustrated in FIG. 1, the substrate including a thin film transistor illustrated in FIG. 2 according to the present embodiment may include source/drain areas 203c and 203b of an active layer 203 that are conductive. The source/drain areas 203c and 203b may be made conductive using a plasma process. For example, the gate insulating layer 104 and the gate electrode 105 may be formed to expose the source/drain areas 203c and 203b of the active layer 203, and then a plasma process may be performed using a phosphorous-based gas or boron-based gas before forming the interlayer insulating layer 106. Due to the plasma process, the source/drain areas 203c and 203b of the active layer 203 may be conductive. As the source/drain areas 203c and 203b of the active layer 203 may be conductive, an on current generated due to offset may be prevented from being reduced. Other structures and processes with regard to the substrate illustrated in FIG. 2 may be the same as those for the substrate including the thin film transistor illustrated in FIG. 1. Accordingly, descriptions thereof will not be repeated.

Figure 3:
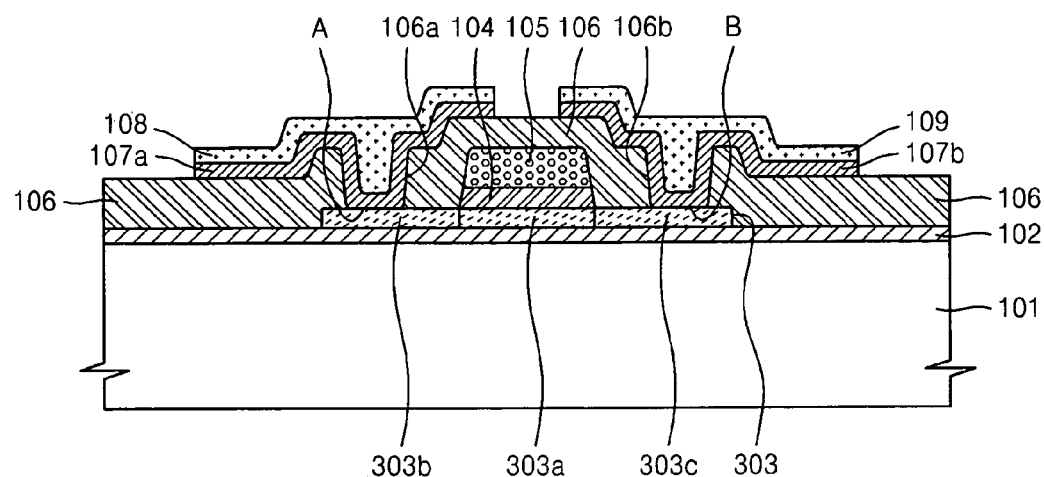
FIG. 3 illustrates a schematic cross-sectional diagram of a substrate including a thin film transistor according to another embodiment.

FIG. 3 illustrates a schematic cross-sectional diagram of a substrate including a thin film transistor according to another embodiment.

As compared to the substrate including the thin film transistor illustrated in FIG. 1, the substrate including a thin film transistor illustrated in FIG. 3 according to the present embodiment may include the first area B and the second area A of source/drain areas 303c and 303b that contact the ohmic contact layers 107a and 107b, wherein the first area B and the second area A are conductive. The first area B and the second area A of the source/drain areas 303c and 303b that contact the ohmic contact layers 107a and 107b may be made conductive using a plasma process. For example, the ohmic contact layers 107a and 107b may be formed, and then a plasma process may be performed using a phosphorous-based gas or boron-based gas. Due to the plasma process, the first area B and the second area A of the source/drain areas 303c and 303b that contact the ohmic contact layers 107a and 107b may be made conductive. As the first area B and the second area A of the source/drain areas 303c and 303b that contact the ohmic contact layers 107a and 107b may be conductive, an on current generated due to offset may be prevented from being reduced. Other structures and processes with regard to the substrate illustrated in FIG. 3 may be the same as those for the substrate including the thin film transistor illustrated in FIG. 1. Accordingly, descriptions thereof will not be repeated.

Figure 4:
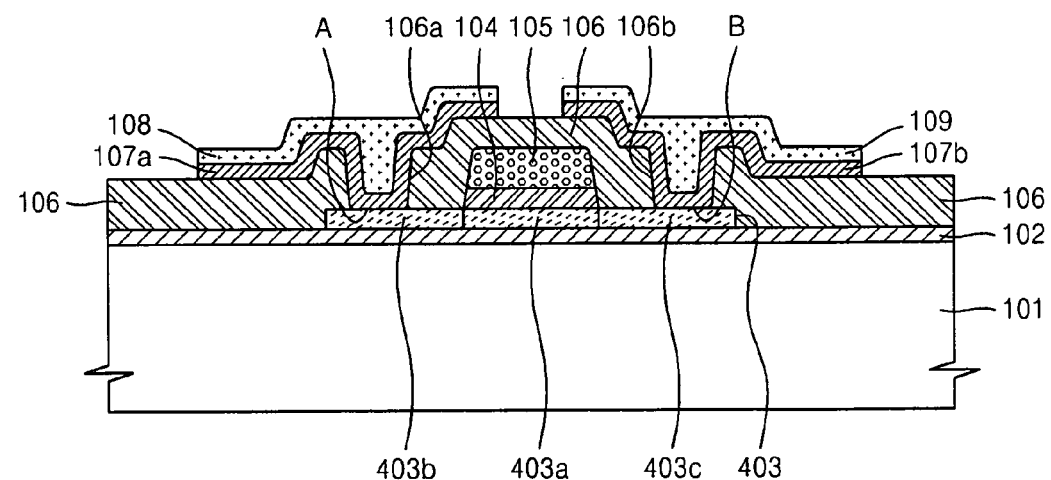
FIG. 4 illustrates a schematic cross-sectional diagram of a substrate including a thin film transistor according to another embodiment.

FIG. 4 illustrates a schematic cross-sectional diagram of a substrate including a thin film transistor according to another embodiment.

As compared to the substrate including the thin film transistor illustrated in FIG. 1, the substrate including a thin film transistor illustrated in FIG. 4 according to the present embodiment may include source/drain areas 403c and 403b of an active layer 403 that are conductive, and the first area B and the second area A of source/drain areas 403c and 403b that contact the ohmic contact layers 107a and 107b, wherein the first area B and the second area A are conductive. Thus, the source/drain areas 403c and 403b of the active layer 403 may be conductive, and then the first area B and the second area A of source/drain areas 403c and 403b that the contact the ohmic contact layers 107a and 107b may be conductive. Conductivity of the first area B and the second area A of source/drain areas 403c and 403b that contact the ohmic contact layers 107a and 107b may be higher than conductivity of other areas except for the first area B and the second area A.

In an implementation, the gate insulating layer 104 and the gate electrode 105 may be formed to expose the source/drain areas 403c and 403b of the active layer 403, and then a plasma process may be performed using a phosphorous-based gas or boron-based gas before forming the interlayer insulating layer 106. Using the plasma process, the source/drain areas 403c and 403b of the active layer 403 may be made conductive. After the plasma process, the interlayer insulating layer 106 and the ohmic contact layers 107a and 107b may be formed, and then a plasma process may be performed using a phosphorous-based gas or boron-based gas. Thus, the plasma process may be performed twice. Using to the second plasma process, the first area B and the second area A of source/drain areas 403c and 403b that contact the ohmic contact layers 107a and 107b may have higher conductivity than other areas except for the first area B and the second area A. As the source/drain areas 403c and 403b of the active layer 403, and the first area B and the second area A of source/drain areas 403c and 403b that contact the ohmic contact layers 107a and 107b, may be conductive, an on current generated due to offset may be prevented from being reduced. Other structures and processes with regard to the substrate illustrated in FIG. 4 are the same as those for the substrate including the thin film transistor illustrated in FIG. 1. Accordingly, descriptions thereof will not be repeated.

Figure 5:
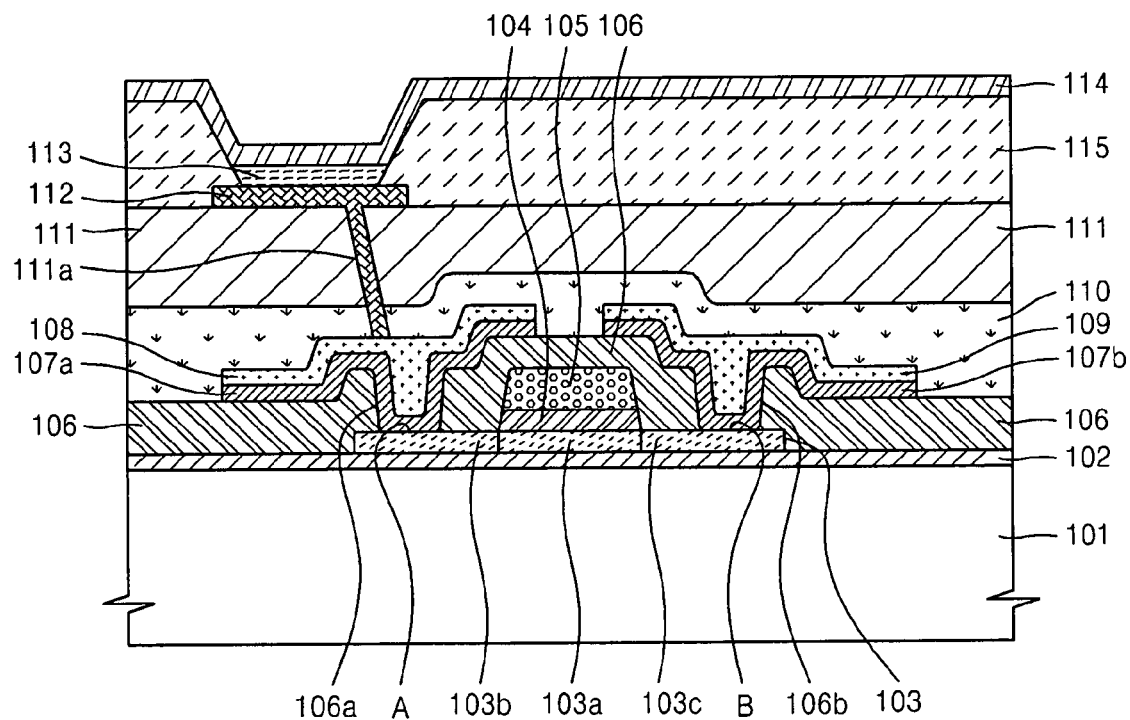
FIG. 5 illustrates a schematic cross-sectional diagram of an organic light emitting display apparatus according to another embodiment.

FIG. 5 illustrates a schematic cross-sectional diagram of an organic light emitting display apparatus according to another embodiment.

Referring to FIG. 5, the organic light emitting display apparatus according to the present embodiment may include a passivation film 110, a planarization film 111, a pixel electrode 112, an intermediate layer 113, and an opposite electrode 114 formed on the substrate including the thin film transistor illustrated in FIG. 1. The organic light emitting display apparatus of FIG. 5 may include the substrate including the thin film transistor illustrated in FIG. 1 or any of the substrates including the thin film transistor illustrated in FIGS. 2 through 4.

The structure below the passivation film 110 may be the same as the structure illustrated in FIG. 1 and thus a description thereof will not be repeated.

The passivation film 110, which may be, e.g., $SiO_2$ or $SiN_x$, may be formed on the source/drain electrodes 109 and 108. The planarization film 111, which may be formed of, e.g., an organic material such as acryl, polyimide, or benzocyclobutene (BCB), may be formed on the passivation film 110.

The pixel electrode 112 may operate as an anode of an organic electroluminescent device and may be formed on the planarization film 111. Also, a pixel defining layer 115, which may be formed of, e.g., an organic material, may cover the pixel electrode 112.

A predetermined opening may be formed in the pixel defining layer 115. Then, the intermediate layer 113 may be formed on the pixel defining layer 115 and the pixel electrode 112 may be exposed through the opening. The intermediate layer 113 may include an emission layer. Various other organic light emitting display apparatuses may be similarly applied.

The organic electroluminescent device may display predetermined image information by emitting red, green, and blue light according to a flow of current. The organic electroluminescent device may includes the pixel electrode 112, the opposite electrode 114, and the intermediate layer 113. The pixel electrode 112 may be connected to the drain electrode 108 of the thin film transistor and receive a positive power voltage, the opposite electrode 114 may cover the entire pixel and supply a negative power voltage, and the intermediate layer 113 may be interposed between the pixel electrode 112 and the opposite electrode 114 and emit light.

The pixel electrode 112 and the opposite electrode 114 may be insulated from each other by the intermediate layer 113, and may apply voltages of different polarities so that light is emitted at the intermediate layer 113.

The intermediate layer 113 may include, e.g., low-molecular weight organic layers or polymer organic layers. If the intermediate layer 113 includes the low-molecular weight organic layers, the intermediate layer 113 may have a single or multi-layered structure including one or more of a hole injection layer (HIL), a hole transport layer (HTL), an emission layer (EML), an electron transport layer (ETL), and an electron injection layer (EIL). Examples of available organic materials may include copper phthalocyanine (CuPc), N,N-di(naphthalene-1-yl)-N,N'-diphenyl-benzidine (NPB), or tris-8-hydroxyquinoline aluminum (Alq3). These low-molecular weight organic layers are formed by, e.g., vacuum deposition.

If the intermediate layer 113 includes the polymer organic layers, the intermediate layer 113 may mostly have a structure including a HTL and an EML. In this case, the HTL may be formed of, e.g., poly(ethylenedioxythiophene) (PEDOT), and the EML may be formed of, e.g., polyphenylenevinylenes (PPVs) or polyfluorenes. The HTL and the EML may be formed by, e.g., screen printing, inkjet printing, or the like. The intermediate layer 113 is not limited thereto and may vary in structure.

The intermediate layer 113 may be formed by, e.g., spin coating. For example, an organic material may be coated to cover the pixel electrode 112 and the pixel defining layer 115. Then, the first substrate 101 may be rotated. The organic material coated on the pixel defining layer 115 may be removed according to the rotation of the first substrate 101, and the organic material coated on the pixel electrode 112 may remain. Then, the organic material coated on the pixel electrode 112 may be plasticized so as to form the intermediate layer 113.

The pixel electrode 112 may function as an anode and the opposite electrode 114 may function as a cathode. In another implementation, the pixel electrode 112 may function as a cathode and the opposite electrode 114 may function as an anode.

The pixel electrode 112 may be, e.g., a transparent or reflective electrode. If the pixel electrode 112 is a transparent electrode, the pixel electrode 112 may formed of, e.g., indium tin oxide (ITO), indium zinc oxide (IZO), zinc oxide (ZnO), or indium oxide ($In_2O_3$). If the pixel electrode 112 is a reflective electrode, the pixel electrode 112 may be formed by, e.g., forming a reflective unit using silver (Ag), magnesium (Mg), aluminum (Al), platinum (Pt), palladium (Pd), gold (Au), nickel (Ni), neodymium (Nd), iridium (Ir), chromium (Cr), or a compound thereof, and forming a layer using ITO, IZO, ZnO, or $In_2O_3$ on the reflective unit.

In addition, the opposite electrode 114 may be, e.g., a transparent or reflective electrode. If the opposite electrode 114 is a transparent electrode, the opposite electrode 114 may function as a cathode and may be formed by, e.g., depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof, to face the intermediate layer 113, and forming an auxiliary electrode layer or a bus electrode line on the deposited metal by using, e.g., a material for forming a transparent electrode such as ITO, IZO, ZnO, or $In_2O_3$, or the like. If the opposite electrode 114 is a reflective electrode, the opposite electrode 114 is formed by, e.g., depositing Li, Ca, LiF/Ca, LiF/Al, Al, Ag, Mg, or a compound thereof on the entire surface of the pixel electrode 114.

As described above, a substrate including a thin film transistor may be manufactured without using ion doping. Thus, a large-sized organic light emitting display apparatus may be easily manufactured.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A substrate including a thin film transistor, the substrate comprising:
   an active layer disposed on the substrate, the active layer including a channel area and source and drain areas;
   a gate electrode disposed on the active layer, the channel area corresponding to the gate electrode;
   a gate insulating layer interposed between the active layer and the gate electrode;
   an interlayer insulating layer disposed to cover the active layer and the gate electrode, the interlayer insulating layer having first and second contact holes partially exposing the active layer;
   source and drain electrodes disposed on the interlayer insulating layer and in the first and second contact holes of the interlayer insulating layer, the source and drain areas corresponding to the source and drain electrodes; and
   ohmic contact layers on the interlayer insulating layer and in the first and second contact holes, the ohmic contact layers being interposed between the interlayer insulating layer and the source and drain electrodes and contacting the source and drain areas through the first and second contact holes.

2. The substrate as claimed in claim 1, wherein the ohmic contact layers include:
   amorphous silicon layers including ion impurities, or
   multi-crystalline silicon layers including ion impurities.

3. The substrate as claimed in claim 2, wherein the ion impurities are N+ or P+ impurities.

4. The substrate as claimed in claim 2, wherein the ohmic contact layers are plasma enhanced chemical vapor deposition (PECVD) layers formed by injecting phosphorous-based gas or boron-based gas during forming of the amorphous silicon layers or the multi-crystalline silicon layers.

5. The substrate as claimed in claim 2, wherein the source and drain areas are conductive.

6. The substrate as claimed in claim 5, wherein the source and drain areas are conductive due to a plasma process using phosphorous-based gas or boron-based gas.

7. The substrate as claimed in claim 5, wherein first and second portions of the source and drain areas that contact the ohmic contact layers have a greater conductivity than portions of the source and drain areas that do not contact the ohmic contact layers.

8. The substrate as claimed in claim 7, wherein the first and second areas are conductive due to a plasma process using phosphorous-based gas or boron-based gas after forming the ohmic contact layers.

9. The substrate as claimed in claim 2, wherein first and second portions of the source and drain areas that contact the ohmic contact layers are conductive.

10. The substrate as claimed in claim 9, wherein the first and second areas are conductive due to a plasma process using phosphorous-based gas or boron-based gas after forming the ohmic contact layers.

11. The substrate as claimed in claim 1, further comprising a buffer layer interposed between the substrate and the active layer to cover the substrate, and wherein:
    the interlayer insulating layer directly contacts the active layer and the gate electrode, and
    the ohmic contact layers are interposed between the interlayer insulating layer and the source and drain electrodes such that the source and drain electrodes do not directly contact the interlayer insulating layer.

12. An organic light emitting display apparatus, comprising:
- an active layer disposed on a substrate, the active layer including a channel area and source and drain areas;
- a gate electrode disposed on the active layer, the channel area corresponding to the gate electrode;
- a gate insulating layer interposed between the active layer and the gate electrode;
- an interlayer insulating layer disposed to cover the active layer and the gate electrode, the interlayer insulating layer having first and second contact holes partially exposing the active layer;
- source and drain electrodes disposed on the interlayer insulating layer and in the first and second contact holes of the interlayer insulating layer, the source and drain areas corresponding to the source and drain electrodes;
- ohmic contact layers on the interlayer insulating layer and in the first and second contact holes, the ohmic contact layers being interposed between the interlayer insulating layer and the source and drain electrodes and contacting the source and drain areas through the first and second contact holes;
- a passivation film covering the source and drain electrodes;
- a planarization film disposed on the passivation film;
- a pixel electrode disposed on the planarization film, the pixel electrode being connected to the drain electrode;
- a pixel defining layer exposing the pixel electrode;
- an intermediate layer disposed on the pixel electrode, the intermediate layer configured to emitting light; and
- an opposite electrode covering the intermediate layer and the pixel defining layer.

13. The organic light emitting display apparatus as claimed in claim 12, wherein the ohmic contact layers include:
- amorphous silicon layers including ion impurities, or
- multi-crystalline silicon layers including ion impurities.

* * * * *